US007061759B2

(12) United States Patent
Karppinen et al.

(10) Patent No.: US 7,061,759 B2
(45) Date of Patent: Jun. 13, 2006

(54) ARRANGEMENT FOR THE PLACEMENT OF FREQUENCY CONVERTERS

(75) Inventors: Veijo Karppinen, Vaasa (FI); Risto Komulainen, Klaukkala (FI)

(73) Assignee: Vacon Oyj, Vaasa (FI)

( * ) Notice: Subject to any disclaimer, the term of this patent is extended or adjusted under 35 U.S.C. 154(b) by 6 days.

(21) Appl. No.: 10/820,049

(22) Filed: Apr. 8, 2004

(65) Prior Publication Data

US 2004/0201960 A1 Oct. 14, 2004

(30) Foreign Application Priority Data

Apr. 11, 2003 (FI) .................................. 20030551

(51) Int. Cl.
*H05K 7/20* (2006.01)
(52) U.S. Cl. ...................... 361/695; 361/690; 361/694; 174/16.1; 165/104.33; 165/122; 454/184
(58) Field of Classification Search ........ 361/688–690, 361/692–699, 724; 174/16.1, 252; 165/80.2, 165/104.33, 122; 454/184
See application file for complete search history.

(56) References Cited

U.S. PATENT DOCUMENTS

| 4,126,269 | A | * | 11/1978 | Bruges ........................ 236/49.3 |
| 4,794,509 | A | | 12/1988 | Nussbaumer | |
| 5,398,159 | A | * | 3/1995 | Andersson et al. ......... 361/695 |
| 5,414,591 | A | * | 5/1995 | Kimura et al. .............. 361/695 |
| 5,969,965 | A | | 10/1999 | Byrne et al. | |
| 6,186,890 | B1 | * | 2/2001 | French et al. ............... 454/184 |
| 6,506,111 | B1 | * | 1/2003 | Sharp et al. ................. 454/184 |
| 6,544,309 | B1 | * | 4/2003 | Hoefer et al. ................ 55/283 |
| 6,611,428 | B1 | * | 8/2003 | Wong ......................... 361/695 |
| 6,628,520 | B1 | * | 9/2003 | Patel et al. .................. 361/696 |
| 6,643,123 | B1 | * | 11/2003 | Hartel et al. ................ 361/678 |
| 6,775,137 | B1 | * | 8/2004 | Chu et al. ................... 361/696 |
| 6,877,551 | B1 | * | 4/2005 | Stoller ........................ 165/47 |

FOREIGN PATENT DOCUMENTS

| JP | 8-289422 A | 11/1996 |
| JP | 10-108323 A | 4/1998 |
| JP | 10-210610 A | 8/1998 |

* cited by examiner

*Primary Examiner*—Boris Chervinsky
(74) *Attorney, Agent, or Firm*—Birch, Stewart, Kolasch & Birch, LLP

(57) ABSTRACT

A method of arranging frequency converters in a cabinet including placing the frequency converters one above the other in a first section of the cabinet, and passing a cooled medium from a second section to a third section of the cabinet such that the cooled medium flows substantially across parts included in the respective frequency converters. Further, the second and third sections are on adjacent sides of the first section. The method also includes arranging supply voltage and load cabling connected to the frequency converters in at least one of the second or third sections of the cabinet.

14 Claims, 2 Drawing Sheets

ARRANGEMENT FOR THE PLACEMENT OF FREQUENCY CONVERTERS

BACKGROUND OF THE INVENTION

1. Field of the Invention

The present invention relates to placement of frequency converters, especially the power units of frequency converters in a switch cabinet or equivalent. In particular, the invention relates to encasement of frequency converters provided with separate power and control units, wherein the power units contain the frequency converter's power stage including power semiconductor switches and the control units contain the required control electronics. The invention also relates to placement of frequency converters provided with a small-size power unit in a switch cabinet or equivalent.

2. Description of the Background Art

Frequency converters are placed in switch cabinets when they are so large that no other type of encasement is appropriate. Frequency converters are also generally placed in a cabinet when the same delivery to a customer comprises several frequency converters (line and group drives), in which case the cabinet functions from the user's point of view as a protection against contact and as a uniform exterior face. As for the units themselves, placement in a cabinet protects them e.g. from water and dust.

Usually one bay in the cabinet is used to accommodate one frequency converter and different bays are interconnected by a set of AC or DC rails e.g. as shown in FIG. 1. FIG. 1 presents three frequency converters FC#11–FC#13, each placed in a separate bay 11–13 in the cabinet. The supply voltage to the frequency converters is normally obtained from a set of power busbars 16 which runs through all the bays and which may be installed e.g. in the upper part of the cabinet. The cables 17 to the motors are normally led downwards from the cabinet. Cooling air is normally passed from below upwards, circulated by a frequency converter-specific fan. The air is most commonly taken through grids mounted in the lower part of the cabinet or through the bottom of the cabinet and removed via the upper part of the cabinet either through the door or through the ceiling.

When there is a need to implement the cabling or air flow in some other way differing from that described above, a considerably large space may be required. For example, if the motor cable has to be led upwards or if supply air is obtained from above piping, it may be necessary to add extra bays 14, 15 as shown in FIG. 2, through which the cabling or air can be arranged to be passed.

SUMMARY OF THE INVENTION

Therefore, an object of the present invention is to overcome the drawbacks of prior-art solutions for the placement of frequency converters, especially their power units, in a cabinet. The invention is particularly applicable for use in conjunction with a frequency converter that has separate power and control units and in which the power unit is of a small size.

According to the invention, the power units of the frequency converters are placed in the cabinet in such a way that the cooling air will pass through them horizontally. The same principle of placement can also be used in conjunction with liquid-cooled power units, thereby achieving the same degrees of freedom in respect of the cooling piping and the cabling.

By applying the invention, the following advantages are achieved:

Several frequency converters or e.g. phase modules constituting a high-power frequency converter can be placed one above the other in the same bay. In this way, considerable space is saved as compared to the background art solution.

The passage of cooling air can be implemented in versatile ways without an extra space requirement; the air may be obtained through the door or grids, from piping above or from below from under the floor, and it can be correspondingly removed in the same directions.

Fans may be provided separately for each power unit or each bay.

The incoming and outgoing cables can be led just as easily downwards as upwards without an extra space requirement.

By sealing off the channel for the air flowing through the power units, a structure fulfilling e.g. tightness class IP54 will be easily achieved. The power units are most naturally placed in the back part of the cabinet, a space being thus left in the front part for the control units and e.g. client-specific relay systems.

BRIEF DESCRIPTION OF THE DRAWINGS

In the following, the invention will be described in detail with reference to an example and the attached drawings, wherein.

DETAILED DESCRIPTION OF THE PREFERRED EMBODIMENTS

Figure 1:
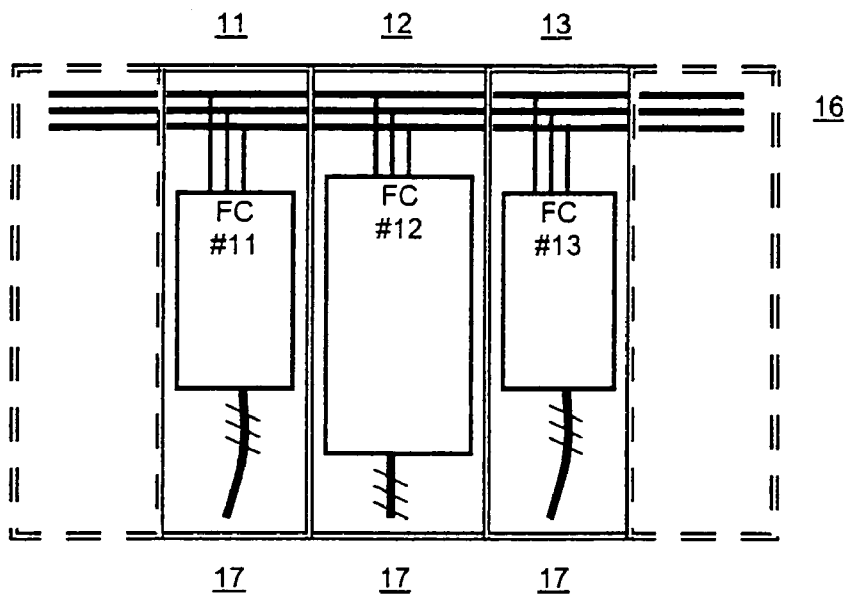
FIG. 1 illustrates prior-art placement of power units in a cabinet.
Figure 2:
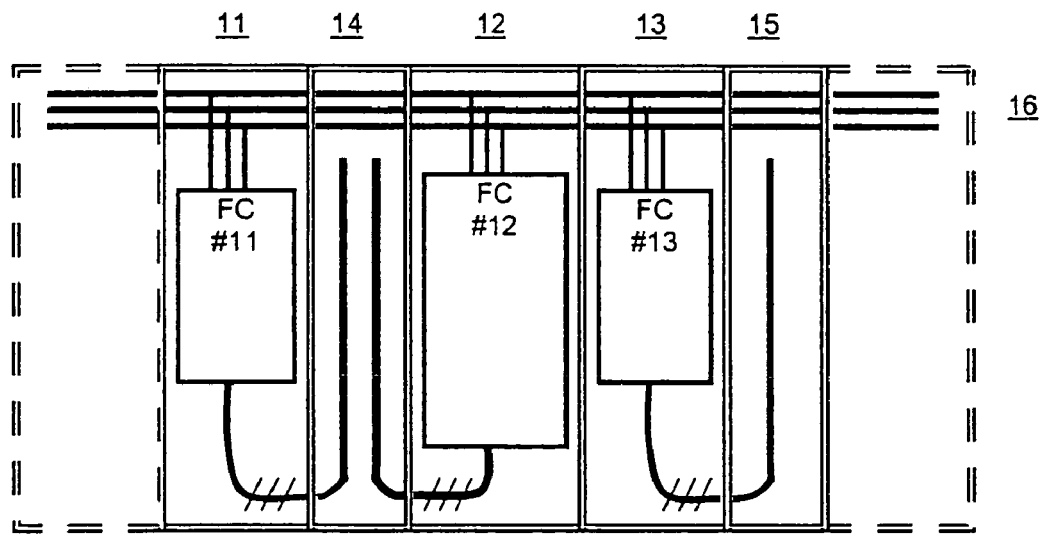
FIG. 2 illustrates prior-art placement of power units in a cabinet when the cooling air or outgoing cabling comes from above.
Figure 3:
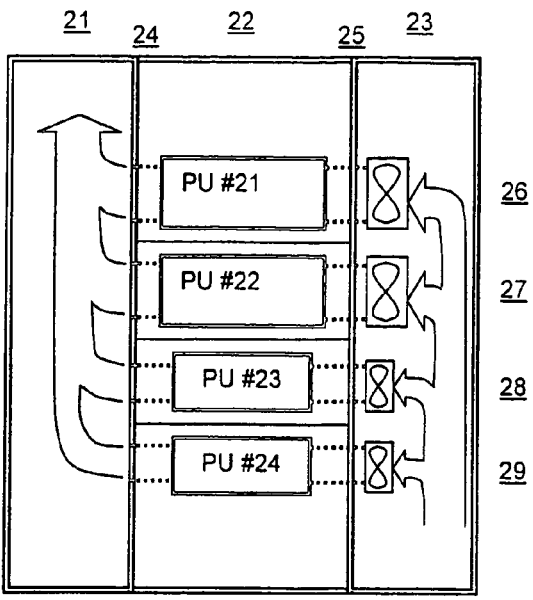
FIG. 3 illustrates placement of air-cooled power units in a cabinet and passage of cooling air according to the present invention.

FIG. 3 presents an example of placement of air-cooled power units in a cabinet according to the invention. It shows four power units PU#21–PU#24, which contain e.g. the frequency converter components requiring cooling, and which units are placed in the cabinet (adjacent bays 21–23) one above the other in the middle bay 22. In the case illustrated in this example, for each power unit PU#21–PU#24 a separate fan 26–29 is provided in the adjacent bay 23, so that cooling air AIR1 flows from the lower part of the fan bay 23 via apertures 24, 25 between the bays through each power unit and further via the upper part of the adjacent bay 21 away from the cabinet. It is also possible to provide a common fan for all the power units placed in the same bay.

Figure 4:
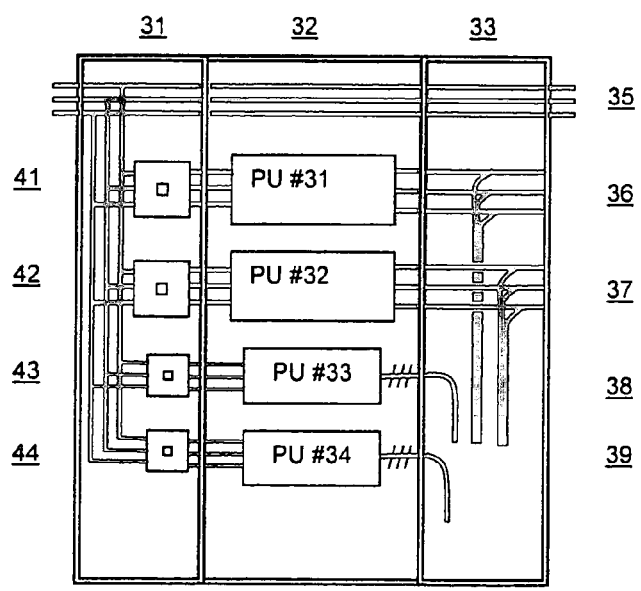
FIG. 4 illustrates placement of power units in a cabinet and cabling according to the invention.

FIG. 4 illustrates how the input and output power cabling can be arranged according to the invention when the placement arrangement of the power units in a cabinet is as shown in the example case in FIG. 3.

The supply voltage for the power units is obtained from a set of power busbars 35 running through all the bays 31–33 and installed in the upper part of the cabinet. Placed in the cabinet are additionally two high-power power units PU#31 and PU#32 as well as two low-power power units PU#33 and PU#34. The right-hand bay 33 is a space for outgoing cabling, in which space are placed the 3-phase rail cable couplings 36, 37 for the high-power power units and the cabling 38, 39 of the low-power power units. The left-hand bay 31 is a space for incoming cabling and possible power unit-specific disconnectors 41–44.

Figure 5:
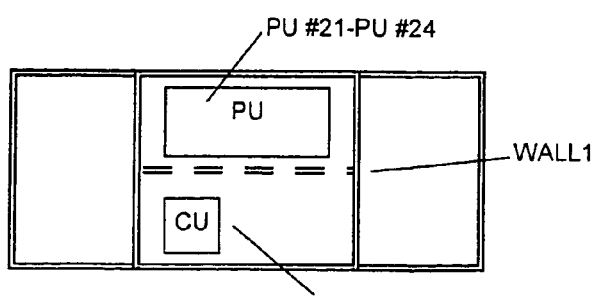
FIG. 5 illustrates placement of power and control units in a cabinet in sectional view from above.

The power units can be placed in the back part of the cabinet, in which case there will be a space left in the front part for the control units CU#21–CU#24 and e.g. client-specific relay systems. The front and back parts of the cabinet can be separated from each other by a wall WALL1, in which case the cooling of the power units is effected by fans while the cooling of the control units takes place gravitationally. In this case, the power units need not be shielded from contact (FIG. 5).

It is obvious to the person skilled in the art that different embodiments of the invention are not limited to the examples described above, but that they may be varied within the scope of the claims presented below.

The invention claimed is:

1. A method of arranging frequency converters in a cabinet comprising:
   placing the frequency converters one above the other in a first section of the cabinet;
   passing a cooling medium from a second section to a third section of the cabinet such that the cooling medium flows substantially across parts included in the respective frequency converters, said second and third sections being on adjacent sides of the first section; and
   arranging supply voltage and load cabling connected to the frequency converters in at least one of the second or third sections of the cabinet,
   wherein the parts of the frequency converters include power units powering the frequency converters,
   wherein passing the cooling medium passes the cooling medium across the power units, and
   wherein placing the frequency converters comprises:
   placing the power units of the frequency converters at a back of the cabinet;
   placing control units of the frequency converters at a front of the cabinet; and
   separating the front and back of the cabinet with a wall.

2. The method of claim 1, wherein the cooling medium is pumped through a portion of the back of the cabinet to directly cool the power units of the frequency converters.

3. The method of claim 1, wherein passing the cooling medium comprises:
   placing individual fans near each side surface of the respective frequency converters so the cooling medium is forced to flow substantially horizontally through the frequency converters.

4. The method of claim 1, wherein forcing the cooling medium comprises:
   placing a common fan in the second or third sections so the cooling medium pumped is forced to flow substantially horizontally through the frequency converters.

5. The method of claim 1, wherein arranging the supply voltage and load cabling comprises:
   arranging outgoing cabling attached to an output of the frequency converters in the second section such that the outgoing cables exit the cabinet at a lower portion of the second section; and
   arranging incoming cabling attached to an input of the frequency converters in the third section such that the incoming cables come into the cabinet at an upper portion of the third section.

6. The method of claim 1, wherein arranging the supply voltage and load cabling comprises:
   arranging outgoing cabling attached to an output of the frequency converters and incoming cables attached to an input of the frequency converters together in the second or third sections.

7. The method of claim 1, wherein passing the cooling medium comprises:
   pumping the cooling medium into a lower portion of the second section of the cabinet;
   forcing the cooling medium pumped into the lower portion through sides of the frequency converters such that the cooling medium flows substantially horizontally across the parts included in the respective frequency converters; and
   allowing the cooling medium to escape the cabinet via an opening in an upper portion of the third space of the cabinet.

8. A frequency converter cabinet comprising:
   frequency converters stacked one above the other in a first section of the cabinet;
   a forcing unit configured to pass a cooling medium from a second section to a third section of the cabinet such that the cooling medium flows substantially across parts included in the respective frequency converters, said second and third sections being on adjacent sides of the first section,
   wherein the second and third section of the cabinet are configured to be arranged with supply voltage and load cabling connected to the frequency converters,
   wherein the parts of the frequency converters include power units powering the frequency converters,
   wherein the forcing unit passes the cooling medium across the power units, and
   wherein the power units of the frequency converters are disposed at a back of the cabinet, control units of the frequency converters are disposed at a front of the cabinet, and a wall separates the front and back of the cabinet.

9. The cabinet of claim 8, wherein the cooling medium is pumped through a portion of the back of the cabinet to directly cool the power units of the frequency converters.

10. The cabinet of claim 8, wherein the forcing unit comprises:
    individual fans disposed near each side surface of the respective frequency converters so the cooling medium pumped is forced to flow substantially horizontally through the frequency converters.

11. The cabinet of claim 8, wherein the forcing unit comprises:
    a common fan disposed in the first side space so the cooling medium pumped is forced to flow substantially horizontally through the frequency converters.

12. The cabinet of claim 8, wherein the second section of the cabinet is configured to receive outgoing cabling attached to an output of the frequency converters such that the outgoing cables exit the cabinet at a lower portion of the second section, and
    wherein the third section of the cabinet is configured to receive incoming cabling attached to an input of the frequency converters such that the incoming cables come into the cabinet at an upper portion of the third section.

13. The cabinet of claim 8, wherein the second or third section is configured to receive both outgoing cabling attached to an output of the frequency converters and incoming cables to an input of the frequency converters.

14. The cabinet of claim 8, wherein the forcing unit forces the cooling medium pumped into a lower portion of the second section such that the cooling medium flows substantially horizontally across the parts included in the respective frequency converters, and wherein the cabinet further includes an opening in an upper portion of the third section to allow air forced across the parts of the frequency converters to escape.

* * * * *